United States Patent [19]

Turner et al.

[11] Patent Number: 5,493,526
[45] Date of Patent: Feb. 20, 1996

[54] METHOD AND APPARATUS FOR ENHANCED EPROM AND EEPROM PROGRAMMABILITY AND PROCESS SCALING

[75] Inventors: John E. Turner, Santa Cruz; Myron W. Wong, San Jose, both of Calif.

[73] Assignee: Altera Corporation, San Jose, Calif.

[21] Appl. No.: 227,500

[22] Filed: Apr. 14, 1994

Related U.S. Application Data

[63] Continuation of Ser. No. 823,917, Jan. 22, 1992, abandoned.

[51] Int. Cl.$^6$ .................................................. G11C 7/00
[52] U.S. Cl. ................................................ 365/185.33
[58] Field of Search ........................... 365/189.01, 900, 365/189.09, 185

[56] References Cited

U.S. PATENT DOCUMENTS

| | | | |
|---|---|---|---|
| 4,888,734 | 12/1989 | Lee et al. | 365/900 |
| 4,939,690 | 7/1990 | Momodomi et al. | 365/185 |
| 5,088,060 | 2/1992 | Endoh et al. | 365/189.01 |
| 5,172,388 | 12/1992 | Mehrotra et al. | 365/900 |

Primary Examiner—David C. Nelms
Assistant Examiner—Son Dinh
Attorney, Agent, or Firm—Townsend and Townsend and Crew; Vernon A. Norviel; Stephen J. LeBlanc

[57] ABSTRACT

An EPROM or EEPROM employs an alternate voltage level of 2 volts replaces solid ground (0 volts) during programming and performs a 'zero' logic level function. This 'soft' zero of 2 volts is applied to bit lines not selected for programming. As a soft zero, this alternative voltage reduces internal voltage stresses and helps prevent field inversion and keep parasitic field transistors between bit lines shut off. By reducing internal voltage stresses on gate oxides, and by helping prevent field inversion, the use of a soft zero voltage allows smaller circuit architectures to be designed for a given high programming voltage.

15 Claims, 3 Drawing Sheets

METHOD AND APPARATUS FOR ENHANCED EPROM AND EEPROM PROGRAMMABILITY AND PROCESS SCALING

This is a continuation of Ser. No. 07/823,917, filed Jan. 22, 1992, now abandoned.

BACKGROUND OF THE INVENTION

This invention relates generally to EPROM and EEPROM operating techniques. Specifically, the invention relates to a biasing technique for improving the programmability of EPROMs and EEPROMs and for allowing further process scaling.

As with many other areas of integrated electronics, manufacturers of EPROMs and EEPROMs strive to produce components having smaller and smaller sizes. Achieving smaller size enables more components to be placed within a given area of a wafer, thereby increasing yields and lowering costs. As process dimensions scale to smaller sizes, however, internal voltage fields within the semiconductor chip must also scale. Scaling these voltage fields is necessary to reduce field stress on gate oxides and junctions, and to maintain field isolation, especially between adjacent diffusions of bit lines.

The meaning of the term 'programming' as used herein needs to be clarified at the outset. For conventional EPROMs, to 'program' a memory transistor is to place a normally low threshold memory transistor at a high threshold. For EEPROMs, some parties have used 'erasing' where others use 'programming'. Hereafter, for EEPROMs, 'programming' refers to placing a high threshold memory transistor at a low threshold.

FIG. 1 is a schematic diagram of a portion of a conventional EPROM or EEPROM array employing conventional programming biasing. This array portion includes bit lines 10 and 20, memory transistors 30 and 40, polysilicon word lines 50–53, metal or diffused lines 60 and 61. A particular memory cell is programmed by bringing both its associated word line and bit line to potential Vpp. Lines 60 and 61 are coupled to ground. Typical CMOS drain programming voltage Vpp is about 2.5 times the read voltage Vcc. Thus, typical voltages for Vpp and Vcc are about 12.5 V and 5 V, respectively. Bit lines with memory cells not selected for programming are connected to ground, or 0 V. As shown in FIG. 1, to program cell 30, word line 50 and bit line 10 are placed at potential Vpp, selecting memory cell 30 for programming. Bit line 20 is grounded, so memory transistor 40 will not be programmed. Depending upon the physical layout of the circuit, a parasitic transistor, with bit lines 10 and 20 as drain and source and word line 50 as gate, can be turned on, potentially adversely affecting operation.

Such a parasitic transistor is especially likely to be formed in an EEPROM employing dual bit lines, because the dual bit lines tend to be spaced more closely together, often separated by only a line width. This phenomenon is illustrated in FIGS. 2 and 3. FIG. 2 is a top view which illustrates the parasitic transistor between dual bit lines of an EEPROM. If a memory cell associated with write bit line 100, read bit line 110, and word line 120 is to be programmed, write bit line 100 conventionally will be brought to Vpp, read bit line 110 to ground (0 V), and word line 120 to Vpp. The undesired parasitic MOS transistor 130 can then be formed by word line 120, coupling bit lines 100 and 110. Because write bit line 100 is generally coupled to a high impedance voltage source, draining even a small amount of current through parasitic transistor 130 to bit line 110 can disrupt circuit operation.

Wherever parasitic transistors may appear, they generally take a form similar to that illustrated in FIG. 3, which is a cross-sectional view of a typical parasitic transistor 200 as formed between two memory cells 201 and 202. Parasitic transistor 200, lying in a P' substrate, includes two column diffusion N⁺ junctions 210 and 220, which are parts of memory cells 201 and 202 and which serve as drain and source to parasitic transistor 200. Under conventional programming biasing, junction 210 could be at Vpp and junction 220 at 0 V. Separating junctions 210 and 220 is a region 230 of field oxide, typically silicon dioxide underneath which lies field region 240, which has been doped with boron to help prevent inversion. Field region 240 cannot be too heavily doped, however, for this doping decreases the junction breakdown voltage Vbj of the active transistors at either side. Lying atop field oxide region 230 is a polysilicon layer 250, such as from a word line, which forms the gate for the parasitic transistor. During programming, this gate 250 may carry Vpp, which could cause field inversion in field region 240, coupling well 210 to well 220.

A variety of techniques have been employed in the prior art in response to the problems that accompany smaller sizes. One of these has been to simply scale down the programming voltage; however, this can be done only so far. Non-volatile technologies such as EPROMs and EEPROMs are particularly sensitive to programming voltage level. Voltage scaling places even more stringent requirements upon process and cell design, and may adversely affect manufacturing margins. Another technique has been to decouple programming circuits, which employ the highest voltage levels, from high speed circuits by use of separate gate oxides and design rules. Use of additional oxide thickness for programming transistors increases process complexity, which is undesirable. Other techniques for prevention of field inversion have been greater isolation spacing and greater field doping levels. However, increasing isolation spacing is contrary to decreasing size, and as mentioned, increasing field doping levels decreases junction breakdown voltages.

What is needed is a technique for building fast and dense EPROM and EEPROM circuits with adequate programming margins for gate oxide stress and field isolation.

SUMMARY OF THE INVENTION

According to the invention, an EPROM, EEPROM, or other programmable logic device that is programmed with a higher than operating level voltage, employs an alternate voltage level in place of solid ground (0 volts) during programming. This alternative voltage provides a 'zero' logic level function, but is slightly above 'hard' ground. As a 'soft' zero, this alternative voltage reduces internal voltage stresses. The soft zero also helps prevent field inversion and keep parasitic field transistors between bit lines turned off. By reducing internal voltage stresses on gate oxides, and by helping prevent field inversion, the use of a soft zero voltage allows smaller circuit architectures to be designed for a given high programming voltage. In one embodiment, a soft zero of 2 volts is applied, instead of ground, to bit lines not selected for programming, where for EPROMs 'programming' is placing a low threshold memory transistor at a high threshold, and for EEPROMs 'programming' is placing a high threshold memory transistor at a low threshold.

DETAILED DESCRIPTION OF THE PREFERRED EMBODIMENTS

Figure 1:
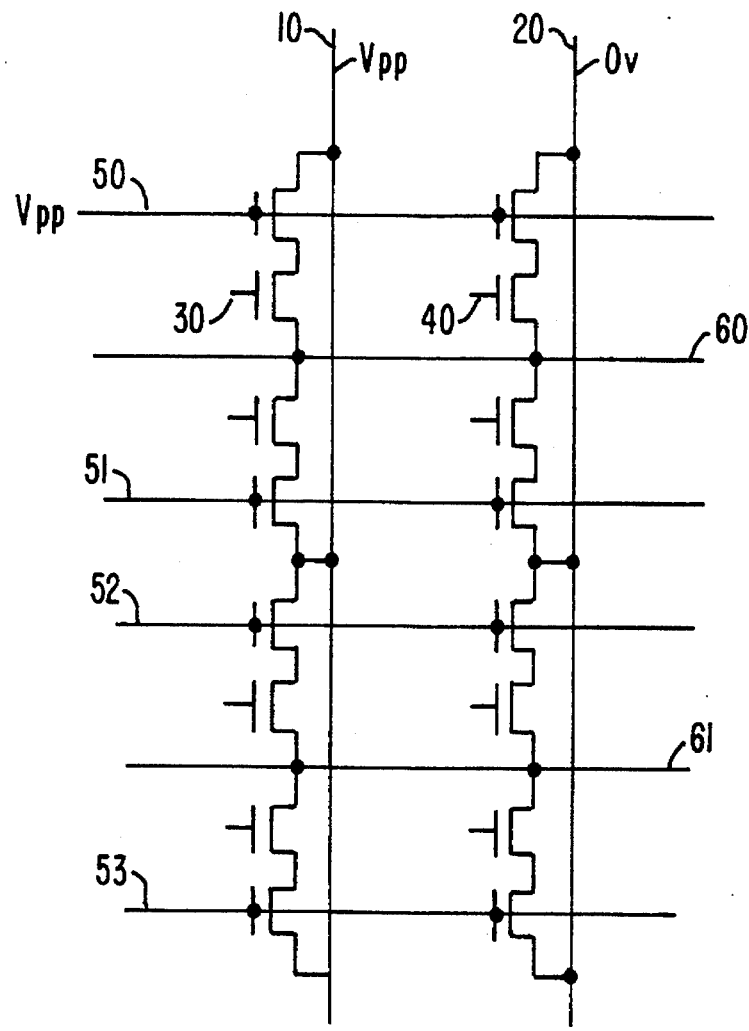
FIG. 1 is a schematic diagram illustrating a portion of a conventional EPROM array employing conventional programming biasing.
Figure 2:
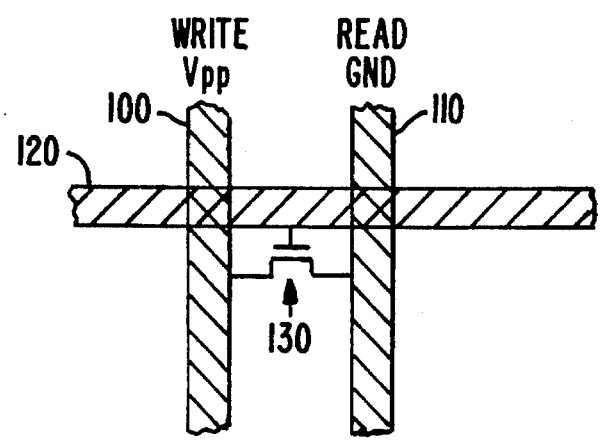
FIG. 2 is a top view illustrating the presence of a parasitic transistor between adjacent bit lines of an EEPROM.
Figure 3:
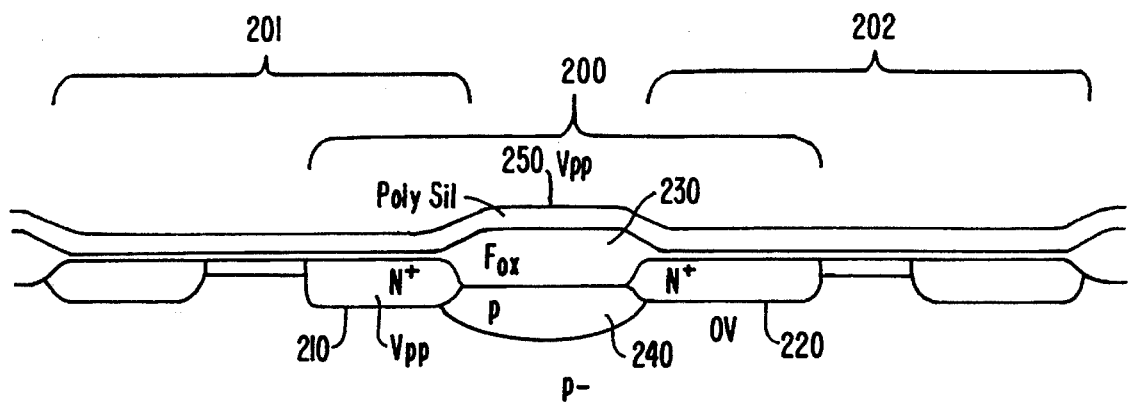
FIG. 3 is a cross-sectional view of a typical parasitic transistor formed between the bit lines.
Figure 4:
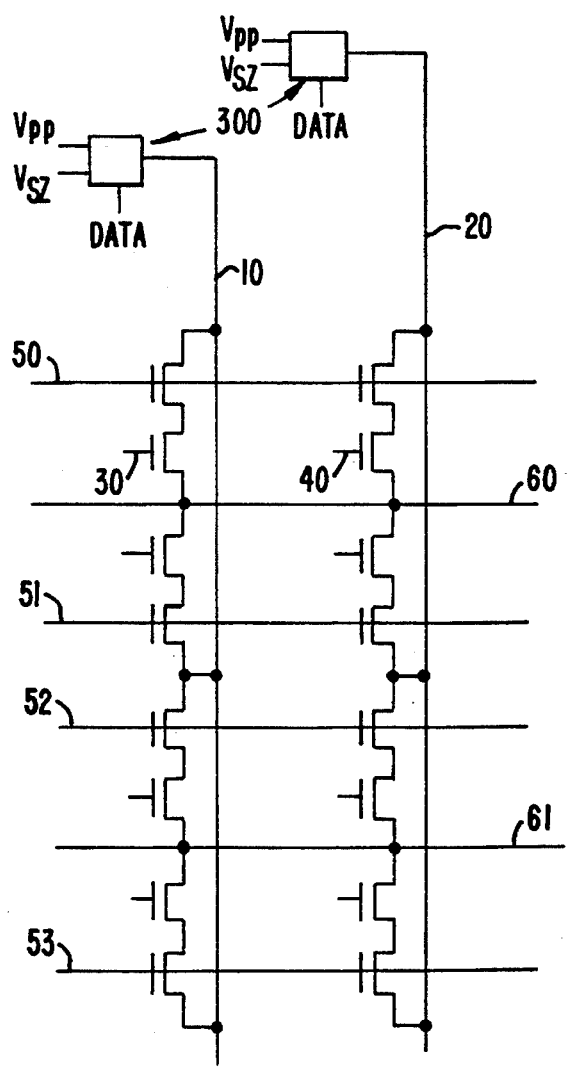
FIG. 4 is a schematic diagram illustrating a portion of an EPROM array employing programming biasing according to the invention.

To allow scaling of process dimensions to smaller sizes in the fabrication of EPROMs, EEPROMs and other high program/configuration voltage devices such as antifuses while maintaining field isolation and minimizing gate oxide voltage stresses, a device according to the present invention employs the programming biasing scheme illustrated for an EPROM in FIG. 4. This circuit is similar to that of FIG. 1, except that it employs a different biasing scheme. In the circuit of FIG. 1, either Vpp or ground, 0 V, is applied to the bit lines, depending upon whether the associated memory transistor is to be programmed. In the circuit of FIG. 4, Vpp is applied to program a memory transistor, but an alternate voltage instead of 0 V is applied to bit lines of memory transistors which are not to be programmed. This alternate voltage is slightly above zero volts and performs a zero logic level function. However, as a "soft" zero Vsz, the alternate voltage Vsz helps reduce gate oxide stress and prevent field inversion. Application of the appropriate one of Vpp and Vsz to each column can be by a two input tristate multiplexer 300, or by other data buffer circuitry. Vsz can also be applied to lines 60 and 61 during programming to further reduce gate oxide stresses.

Figure 5A:
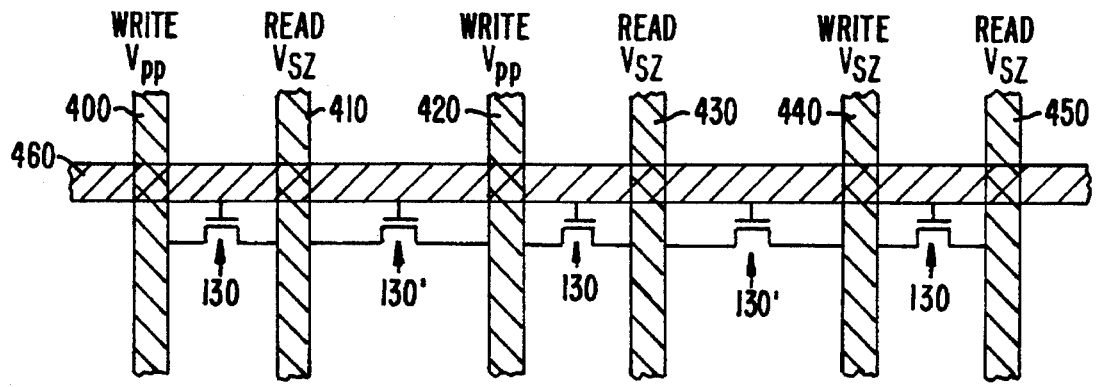
FIGS. 5A–5C are drawings illustrating different biasing schemes.

In a dual bit line architecture, this biasing scheme can be implemented as shown in FIG. 5A, which shows write/read bit line pairs 400/410, 420/430, and 440/450, and word line 460. Parasitic transistors 130 appear between bit lines of each write/read pair, and parasitic transistors 130' which are separated by a greater width of field oxide and thus have a higher turn-on or threshold voltage, appear between adjacent bit line pairs. The memory transistors associated with word line 460 and bit line pairs 400/410 and 420/430 are to be programmed, and that of bit line pair 440/450 is not to be programmed. Vpp is therefore applied to write bit lines 400 and 420, with soft zero Vsz applied to read bit lines 410, 430, 450 and to write bit line 440. This use of the soft zero again reduces gate oxide stresses and helps prevent field inversion.

Figure 5B:
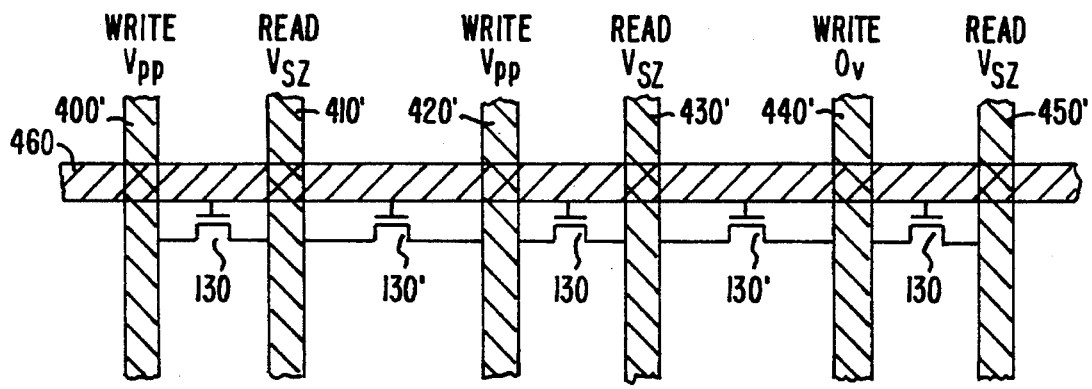
Figure 5C:
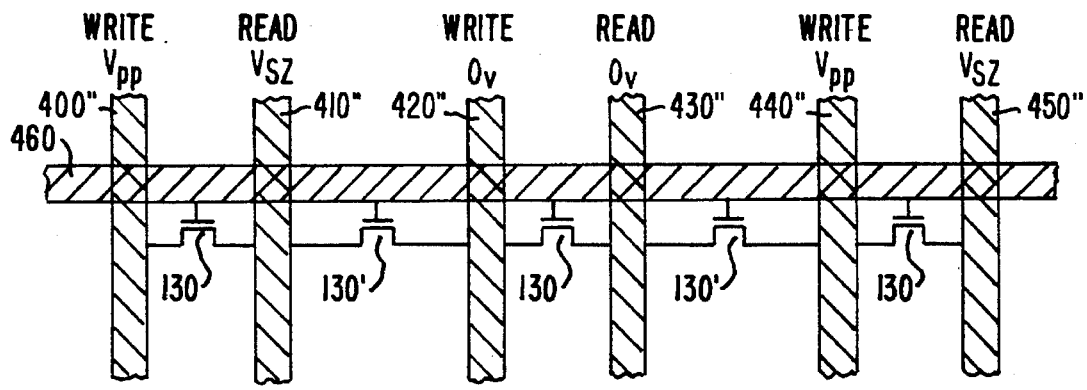

An alternate biasing scheme for dual bit line configurations is shown in FIG. 5B. In the biasing scheme of FIG. 5B, write bit lines not selected for programming (i.e. bit line 440') are coupled to ground, 0 V. Because these write bit lines all have read bit lines adjacent to them, which are at a low voltage during programming and which do not need voltage present, coupling through parasitic transistors is of less concern between a read bit line and a non-programming write bit line. By applying hard ground to the write bit lines, however, this biasing scheme does not fully take advantage of the gate oxide stress benefits of the soft zero. Yet another biasing scheme is shown in FIG. 5C. This biasing scheme relies on parasitic transistors 130' being of less concern than parasitic transistors 130, because of their higher threshold voltage, and employs Vsz only with the read bit lines of memory transistors which are being programmed and whose write bit lines would therefore be coupled to Vpp. This biasing scheme, too does not fully take advantage of the gate oxide stress benefits of the soft zero. Other dual bit line schemes, such as RWWRRW (as opposed to the WRWRWR illustrated here), could emply similarly adapted biasing schemes. In general, the field inversion benefits of the soft zero can be obtained by applying the soft zero to the driven connections (i.e. source and/or drain) of a transistor adjacent to a neighbor-transistor driven connection at a high programming voltage.

Figure 6:
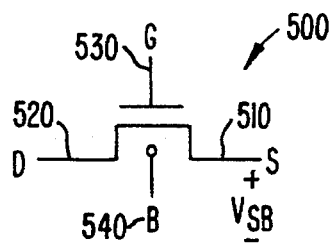
FIG. 6 is a schematic of a parasitic transistor model.

Understanding the manner in which the use of the soft zero helps prevent field inversion can be aided by consideration of a model of the parasitic transistors. Consideration of this model also provides information useful in determining the optimal voltage level for the soft zero and the extent of its effect. Parasitic transistors can be modelled as regular field effect transistors. To account for the soft zero being applied, the proper model is as shown in FIG. 6. Parasitic transistor 500 has a source 510, a drain 520, a gate 530, and a substrate (B) 540. As discussed earlier, gate 530 could be a word line and the source and drain could be bit lines. During programming, gate 530 and drain 520 would be held at Vpp, while, according to the invention, source 510 would be held at Vsz. Vsz appears as Vse in the model, the source to substrate voltage. The threshold voltage $V_T$ for such a transistor as a function of $V_{SB}$ is as follows:

$$V_T = V_{T0} + \gamma(\sqrt{V_{SB} + 2\phi} - \sqrt{2\phi}),$$

where $V_{TO} = V_T$ with the source grounded ($V_{SB} = 0$), and where $$\gamma = \sqrt{2q\,\epsilon_{Si}N_A}\ \frac{t_{ox}}{\epsilon_{ox}}.$$

Given a particular acceptable $V_T$, the level of Vsz thus can be based upon oxide thickness and process scale.

Figure 7:
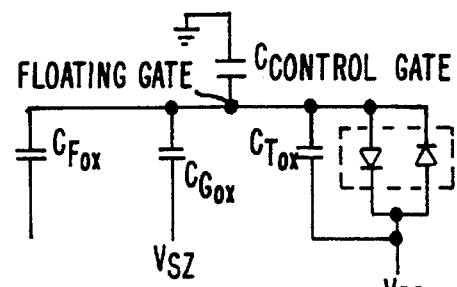
FIG. 7 is a schematic illustrating a capacitive transistor model.

Another model useful in determining a desired level for Vsz is shown in FIG. 7. This is a conventional capacitive model of a memory transistor, which shows the capacitive voltage coupling that contributes to the voltage of the memory transistor floating gate during programming. The degree of coupling will be described as a percentage which reflects an amount of voltage differential that is transferred to the floating gate through a particular path. These percentages are based typical values for the various capacitive influences, but of course may vary. The percentage of coupling through the control gate to ground is the largest, roughly 80%. The percentage of coupling through the tunnel oxide to Vpp is roughly 4%, through the field oxide to substrate ground is roughly 1%, and through the gate oxide to the applied soft zero voltage is roughly 15%. To maximize the current flowing through the tunnel oxide, which is what programs the memory transistor, other contributions to the floating gate voltage should be minimized. For this reason, Vsz cannot be made too large or it will adversely affect programmability of the memory transistors.

So, the primary considerations for establishing a level for the soft zero include the need for it to perform a logic zero function when it is applied (which generally mandates that Vsz be below Vcc), minimizing capacitive voltage contribution to the floating gate, and determining the desired relationship between the turn on voltages of parasitic capacitors and field oxide thicknesses. Vsz may generally be between 0 and roughly 5 volts, preferably between about 1.0 and about 2.5 volts. In one embodiment a soft zero voltage level of 2 volts was chosen as being desirable because it was within the preferred range and because it was already available on the integrated circuit for other purposes.

The invention has now been explained with reference to specific embodiments. Other embodiments and variations will now be apparent to those of ordinary skill in the art familiar with this disclosure. It is therefore not intended that this invention be limited except as indicated by the appended claims.

What is claimed is:

1. An integrated circuit device having memory cells programmed at a high programming voltage higher than operating voltage, said device comprising:
    a) a plurality of memory cell transistors sharing a word line, said memory transistors having sources and drains coupled to doped column regions said doped column regions being separated by a nonconducting region;
    b) program selecting means for selecting a first group of said memory transistors for programming, said program selecting means including means for coupling diffused drains of said first group of memory transistors to said high programming voltage for a period of time; and
    c) means for selecting a second group of said plurality of memory transistors for program voltage protection, at least some of said second group of memory transistors adjacent said first group of memory transistors, wherein said second group of memory transistors are not selected for programming, said means for selecting a second group including means for coupling diffused column regions of said second group of memory transistors to an alternate programming voltage below said operating voltage and above ground level during said period of time.

2. The device of claim 1, wherein said means for selecting a second group comprises means for coupling all column regions of said second group of memory transistors to said alternate voltage.

3. The device of claim 1, wherein said means for selecting a second group selects the second group to comprise all of said plurality of memory transistors not selected for programming.

4. The device of claim 1, wherein said plurality of memory cell transistors comprise EPROM memory cell transistors.

5. The device of claim 1, wherein said plurality of memory cell transistors comprise EEPROM memory cell transistors.

6. The device of claim 5, wherein said memory cells comprise dual bit line memory cells having both a write bit line and a read bit line, and wherein
    a) said means for selecting a first group couples write bit lines of said first group of memory transistors to said high programming voltage, and wherein
    b) said means for selecting a second group couples only read bit lines of said plurality of memory transistors to said alternate programming voltage.

7. The device of claim 6, wherein said means for selecting a second group couples all write bit lines of all of said plurality of memory transistors not selected for programming to said alternate programming voltage.

8. The device of claim 1, wherein said alternate voltage is at least about 0.5 V and less than about one half said operating voltage.

9. The device of claim 8, wherein said operating voltage is about 5 V and said alternate voltage is about 2 V.

10. A method of programming memory cells programmed at a high programming voltage higher than operating voltage, said method comprising the steps of:
    a) selecting a memory cell transistor for programming;
    b) applying said programming voltage via a first control line to one electrode of said selected memory cell transistor; and
    c) applying an alternate programming voltage via a control line not connected to said selected memory cell to an electrode of a transistor adjacent to said selected memory cell transistor, wherein said alternate voltage is below said operating voltage and above ground level.

11. The method of claim 10, wherein
    a) said selecting step comprises selecting at least one memory transistor of a plurality of memory transistors sharing a word line; and wherein
    b) said step of applying said alternate programming voltage comprises applying said alternate programming voltage to sources and drains of any of said plurality of memory transistors not selected for programming.

12. A method of programming memory cells programmed at a high programming voltage higher than operating voltage, said method comprising the steps of:
    a) selecting a memory cell transistor for programming comprising selecting at least one memory transistor of a plurality of memory transistors sharing a word line;
    b) applying said programming voltage to one electrode of said selected memory cell transistor; and
    c) applying an alternate programming voltage to an electrode of a transistor adjacent to said selected memory cell transistor, wherein said alternate voltage is below said operating voltage and above ground level comprising applying said alternate programming voltage to sources and drains of any of said plurality of memory transistors not selected for programming wherein said memory cells are dual bit line memory cells having a write bit line and a read bit line, and wherein said step of applying said alternate voltage comprises applying said alternate programming voltage only to substantially all read lines of said plurality of memory cells.

13. The method of claim 12 wherein said step of applying an alternate programming voltage comprises applying a voltage above about 0.5 V and below about one half said operating voltage.

14. The method of claim 13 wherein said operating voltage is about 5 V and wherein said step of applying an alternate programming voltage comprises applying a voltage of about 2 V.

15. A method of programming memory cells programmed at a high programming voltage higher than operating voltage, said memory cells arranged in an array connected in one direction by a plurality of word-lines and in another direction by a plurality of bit-lines, said method comprising the steps of:
    a) selecting a memory cell transistor for programming by applying a programming voltage to a bit-line and word-line connected to said memory cell; and
    b) applying an alternate programming voltage to bit-lines adjacent to the bit-line of said selected memory cell wherein said alternate voltage is below said operating voltage and above ground level.

* * * * *